United States Patent
Jang et al.

(10) Patent No.: US 10,148,086 B2
(45) Date of Patent: Dec. 4, 2018

(54) POWER SWITCH CAPABLE OF PREVENTING REVERSE CONNECTION

(71) Applicants: Hyundai Motor Company, Seoul (KR); Kia Motors Corporation, Seoul (KR); Industry-Academic Cooperation Foundation, Dankook University, Yongin, Gyeonggi-do (KR)

(72) Inventors: Sang Hyun Jang, Gyeonggi-do (KR); Sun Woo Kim, Seoul (KR); Hee Jun Lee, Seoul (KR); Shi Hong Park, Seoul (KR); Jun Sik Kim, Chungcheongbuk-do (KR); Jae Hyun Park, Gyeonggi-do (KR)

(73) Assignees: Hyundai Motor Company, Seoul (KR); Kia Motors Corporation, Seoul (KR); Industry-Academic Cooperation Foundation, Dankook University, Yongin, Gyeonggi-do (KR)

( * ) Notice: Subject to any disclaimer, the term of this patent is extended or adjusted under 35 U.S.C. 154(b) by 207 days.

(21) Appl. No.: 15/241,476

(22) Filed: Aug. 19, 2016

(65) Prior Publication Data

US 2017/0163033 A1  Jun. 8, 2017

(30) Foreign Application Priority Data

Dec. 3, 2015 (KR) .................. 10-2015-0171721

(51) Int. Cl.
*H02H 11/00* (2006.01)
*H02H 1/00* (2006.01)

(52) U.S. Cl.
CPC ........ *H02H 11/003* (2013.01); *H02H 1/0007* (2013.01)

(58) Field of Classification Search
CPC .......................... H02H 11/003; H02H 1/0007
See application file for complete search history.

(56) References Cited

U.S. PATENT DOCUMENTS

| | | | | |
|---|---|---|---|---|
| 4,929,884 A * | 5/1990 | Bird | ......................... | G05F 3/24 257/E27.064 |
| 5,519,557 A * | 5/1996 | Kopera, Jr. | .......... | H02H 11/003 361/77 |
| 6,969,971 B2 * | 11/2005 | Dubhashi | ............. | H02H 11/003 320/107 |
| 9,673,612 B2 * | 6/2017 | Gofman | ................... | H02H 3/18 |
| 2004/0150927 A1 * | 8/2004 | Strayer | .................... | H02H 9/04 361/82 |

(Continued)

FOREIGN PATENT DOCUMENTS

| | | |
|---|---|---|
| JP | 6-70459 | 3/1994 |
| JP | 2001-224135 | 8/2001 |

(Continued)

*Primary Examiner* — Zeev V Kitov
(74) *Attorney, Agent, or Firm* — Mintz Levin Cohn Ferris Glovsky and Popeo, P.C.; Peter F. Corless

(57) ABSTRACT

A power switch capable of preventing a reverse connection is provided. The power switch includes a switch that is configured to supply power of a battery to a load or block the power of the battery and a protector that is connected to an output terminal of the switch and blocks the power applied from the battery when the battery is reversely connected and a driver is configured to operate a driving of the switch and the protector.

10 Claims, 5 Drawing Sheets

(56) References Cited

U.S. PATENT DOCUMENTS

2006/0091961 A1* 5/2006 Briskin .................. H03F 1/523
                                                      330/298
2017/0117238 A1* 4/2017 Romig .................... H01L 21/50

FOREIGN PATENT DOCUMENTS

| JP | 2002-095159 A | 3/2002 |
|----|---------------|--------|
| JP | 2004-248088 | 9/2004 |
| JP | 2005-39573 | 2/2005 |
| JP | 2007-082374 A | 3/2007 |
| JP | 2010-206699 | 9/2010 |
| JP | 2014-161147 | 9/2014 |
| KR | 10-2009-0040172 A | 4/2009 |
| KR | 10-2012-0096217 A | 8/2012 |

\* cited by examiner

POWER SWITCH CAPABLE OF PREVENTING REVERSE CONNECTION

CROSS-REFERENCE TO RELATED APPLICATION

This application is based on and claims the benefit of priority to Korean Patent Application No. 10-2015-0171721, filed on Dec. 3, 2015 in the Korean Intellectual Property Office, the disclosure of which is incorporated herein in its entirety by reference.

BACKGROUND

Technical Field

The present disclosure relates to a power switch and more particularly to a power switch capable of preventing a reverse connection that blocks a current supplied from a battery when the battery is reversely connected.

Description of the Related Art

Generally, a switch for a vehicle is replaced with a power switch having high stability and reliability and absent mechanical noise from an existing relay type. However, since an intelligent power switch (e.g., a sense field effect transistor (FET)) according to the related art has a high current sensing error rate, implementation within a protection circuit is difficult. Further, unlike a relay switch, the intelligent power switch according to the related art does not block a current supplied from the battery when the battery is reversely connected, due to an internal parasitic diode (e.g., a body diode). Accordingly, an additional external protection element that prevents the above-mentioned problem is demanded for each of controllers.

The above information disclosed in this section is intended merely to aid in the understanding of the background of the invention and therefore it may contain information that does not form the prior art that is already known in this country to a person of ordinary skill in the art.

SUMMARY

An aspect of the present disclosure provides a power switch capable of preventing a reverse connection that blocks a current supplied from a battery when the battery is reversely connected.

According to an exemplary embodiment of the present disclosure, a power switch capable of preventing a reverse connection may include a switch configured to supply power of a battery to a load or block the power of the battery, a protector coupled to an output terminal of the switch and configured to block the power applied from the battery when the battery is reversely connected and a driver configured to execute a driving of the switch and the protector.

The switch may be implemented as an internal high voltage field effect transistor (FET). The high voltage FET may have a n-type double-diffused metal oxide semiconductor (DMOS) structure. The protector may include a first FET configured to measure a current and a second FET configured to block the current supplied from the battery by a parasitic diode when the battery is reversely connected. Gate terminals of the first FET and the second FET may be coupled to an output terminal of the driver and source terminals thereof may be connected to a source terminal of the high voltage FET. The first FET and the second FET may be implemented as an internal low voltage FET. The low voltage FET may have an n-type complementary metal-oxide semiconductor (CMOS) structure.

The power switch may further include a sensor coupled to a drain terminal of the first FET and configured to sense a load current. The first FET and the second FET may be configured to transfer a current output from the switch at a ratio of 1:N. The protector may be formed by the same process as the sensor and the driver. The driver may be configured to execute a load driving based on a controller positioned external to the power switch. The controller may be configured to measure the load current using an external resistor connected in series with an output terminal of the sensor and may be configured to operate the driver based on the measured load current.

BRIEF DESCRIPTION OF THE DRAWINGS

The above and other objects, features and advantages of the present disclosure will be more apparent from the following detailed description when taken in conjunction with the accompanying drawings.

DETAILED DESCRIPTION

Figure 1:
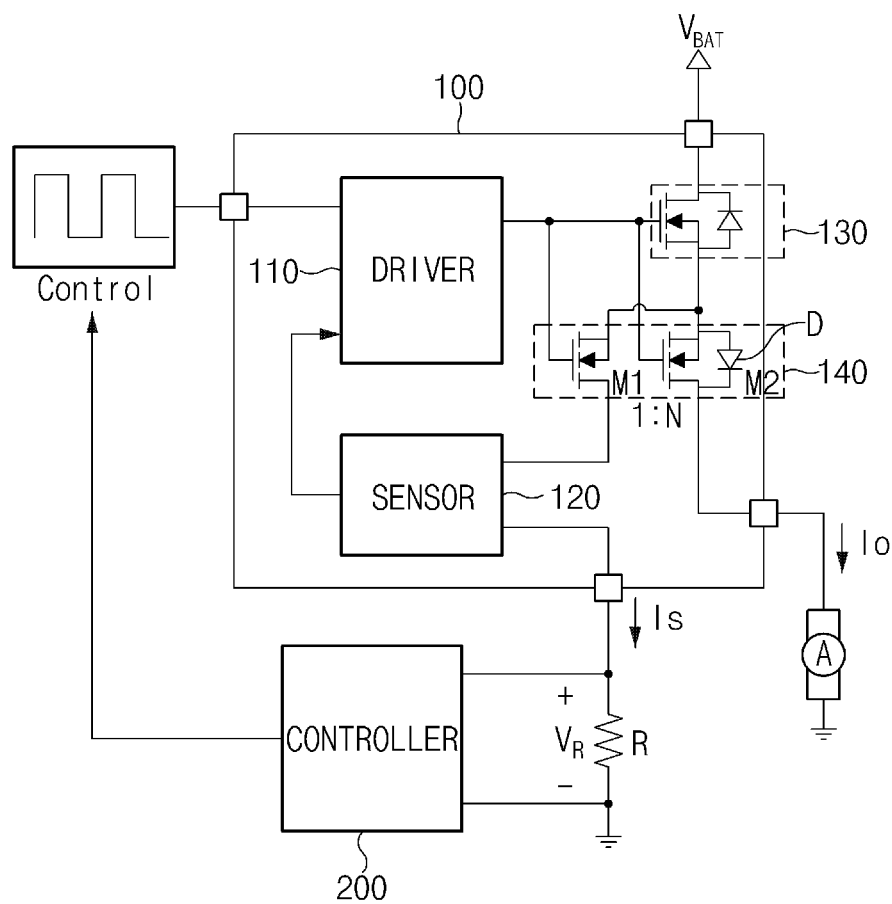
FIG. 1 is an exemplary circuit diagram illustrating a power switch capable of preventing a reverse connection according to an exemplary embodiment of the present disclosure.

Hereinafter, exemplary embodiments of the present disclosure will be described in detail with reference to the accompanying drawings. It is to be noted that in giving reference numerals to components of each of the accompanying drawings, the same components will be denoted by the same reference numerals even though they are shown in different drawings. Further, in describing exemplary embodiments of the present disclosure, well-known constructions or functions will not be described in detail in the case in which they may unnecessarily obscure the understanding of the exemplary embodiments of the present disclosure.

The terminology used herein is for the purpose of describing particular exemplary embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. For example, in order to make the description of the present invention clear, unrelated parts are not shown and, the thicknesses of layers and regions are exaggerated for clarity. Further, when it is stated that a layer is "on" another layer or substrate, the layer may be directly on another layer or substrate or a third layer may be disposed therebetween.

Unless specifically stated or obvious from context, as used herein, the term "about" is understood as within a range of normal tolerance in the art, for example within 2 standard deviations of the mean. "About" can be understood as within 10%, 9%, 8%, 7%, 6%, 5%, 4%, 3%, 2%, 1%, 0.5%, 0.1%, 0.05%, or 0.01% of the stated value. Unless otherwise clear from the context, all numerical values provided herein are modified by the term "about".

It is understood that the term "vehicle" or "vehicular" or other similar term as used herein is inclusive of motor vehicle in general such as passenger automobiles including sports utility vehicles (SUV), buses, trucks, various commercial vehicles, watercraft including a variety of boats, ships, aircraft, and the like and includes hybrid vehicles, electric vehicles, combustion, plug-in hybrid electric vehicles, hydrogen-powered vehicles and other alternative fuel vehicles (e.g. fuels derived from resources other than petroleum).

The present disclosure relates to a power switch for a vehicle, and may improve current sensing error via a low voltage field effect transistor (FET) and may protect the power switch by blocking a current when a power source is reversely connected.

Figure 2:
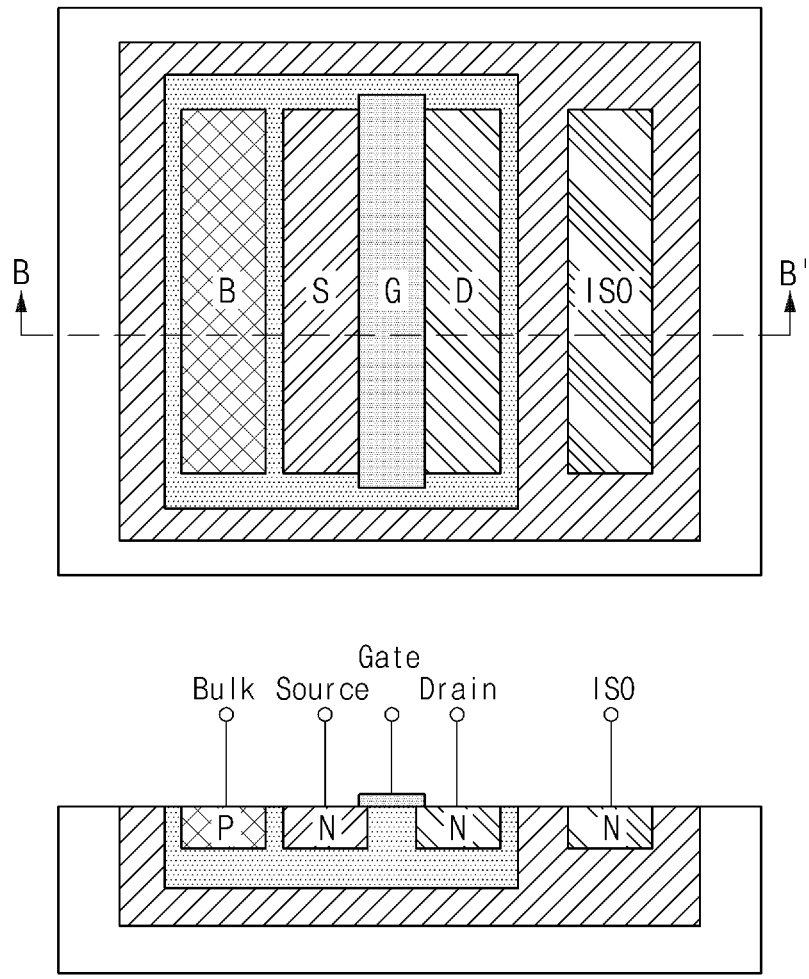
FIG. 2 is an exemplary diagram illustrating a structure of a low voltage field effect transistor (FET) according to an exemplary embodiment of the present disclosure.

FIG. 1 is an exemplary circuit diagram illustrating a power switch capable of preventing a reverse connection according to an exemplary embodiment of the present disclosure. FIG. 2 illustrates a structure of a low voltage field effect transistor (FET) according to an exemplary embodiment of the present disclosure. As illustrated in FIG. 1, a power switch 100 may be disposed between a battery (not illustrated) and a load A, and may be configured to operate under a control of a controller 200. The power switch 100 may be configured to supply (e.g., transfers) power $V_{BAT}$ of the battery to the load A or may be configured to block the $V_{BAT}$ of the battery. For example, the load A may be an electric motor, an actuator, and the like. The power switch 100 may include a driver 110, a sensor 120, a switch 130, and a protector 140. The driver 110 may be configured to operate the switch 130 and the protector 140 based on a control command output from the controller 200. The driver 110 may be configured to drive the switch 130 and the protector 140. The sensor 120 may be configured to measure a load current. The sensor 120 may be configured to output the sensed current to the driver 110 and the exterior.

The switch 130 may be engaged or disengaged (e.g., turned on or off) based on an output (e.g., a control signal) of the driver 110 and may be configured to supply the power $V_{BAT}$ of the battery to the load A or may be configured to block the power $V_{BAT}$ of the battery. In other words, the switch 130 may be configured to adjust a driving of the load A. The switch 130 may be an internal high voltage field effect transistor (FET). A gate terminal of the high voltage FET 130 may be connected to an output terminal of the driver 110, and a drain terminal thereof may be connected to the power $V_{BAT}$ of the battery. The high voltage FET 130 may include a n-type (e.g., n-channel) double-diffused metal oxide semiconductor (DMOS) structure. Further, the high voltage FET 130 may include a round-shaped horizontal cross-sectional structure.

The protector 140 may be configured to perform a reverse connection protection function that blocks power applied to the power switch 100 when the battery is reversely connected, and a current sensing function that measures the load current supplied to the load A through the power switch 100. The protector 140 may be configured of a first FET M1 and a second FET M2 coupled in parallel to each other and have a current transfer ratio of 1:N. For example, N may be predetermined through an experiment, or the like.

Gate terminals of the first FET M1 and the second FET M2 may be connected to the output terminal of the driver 110, and source terminals thereof may be connected to a source terminal of the switch 130. In particular, the gate terminals of the first FET M1 and the second FET M2 may receive the same control signal as a gate terminal of the switch 130. A drain terminal of the first FET M1 may be coupled to an input terminal of the sensor 120, and a drain terminal of the second FET M2 may be coupled to the load A.

The first FET M1 and the second FET M2, may be an internal low voltage FET, and may include an n-type (e.g., n-channel) complementary metal-oxide semiconductor (CMOS) structure, as illustrated in FIG. 2. Since the FET having the CMOS structure may have a minimal withstand voltage, the FET may have a reduced size and a high matching degree of the element. Further, the FET having the CMOS structure may have turn on resistance per a unit area less than the DMOS. Therefore, power loss that may occur by the low voltage FETs which are connected in series with each other may be designed by a resistance value less than a scheme in which an external element may be added to prevent a reverse current (e.g., reverse connection). A parasitic diode (e.g., a body diode) D of the second FET M2 may serve to block the power of the battery when the battery (not illustrated) is reversely connected. In other words, the parasitic diode D of the second FET M2 may prevent the reverse connection of the battery to protect the power switch 100 from the reverse current that may occur when the battery is reversely connected. Since the driver 100, the sensor 120 and the protector 140 configuring the above-mentioned power switch 100 may be formed by the same process, current sensing error by the sensor 120 may be improved.

When the high voltage FET 130, the first FET M1, and the second FET M2 are turned on and the load A is driven, the sensor 120 may be configured to sense the load current using the first FET M1. The sensor 120 may be configured to measure 1/N of a current that passes through the second FET M2 using the first FET M1. In other words, the first FET M1 and the second FET M2 may be configured to distribute a current output from an output terminal of the switch 130 at a ratio of 1:N and transfer the distributed current.

A current sensing scheme using a sense FET based on to the related art is influenced by deviation due to structural characteristics of a laterally diffused metal oxide semiconductor (LDMOS) of a round type. Further, process and temperature deviations occur since the sensor 120 and the protector 140 use different MOSs. Therefore, the current sensing scheme using the sense FET based on the related art configures a current sensing circuit by adding a circuit that corrects the deviation due to structural characteristics of the LDMOS of the round type and the process and temperature deviations. However, since a semiconductor for a vehicle has a wide dynamic range, the correction circuit needs to be applied to the entirety of range to improve error. Since the above-mentioned scheme applies a variety of correction levels based on the temperature and the load current, the error is necessarily very large.

According to the present disclosure, an internal low voltage FET having the CMOS structure having the small process design deviation may be configured to sense the current, a problem such as that in the LDMOS does not occur. Accordingly the current may be determined without an additional correction circuit. Therefore, according to the present disclosure, a structure of a system may be simplified and the current sensing error may be reduced.

The controller 200 may be configured to operate the power switch 100 based on a current Is sensed by the sensor 120 of the power switch 100. In particular, the controller 200 may be configured to detect a voltage $V_R$ applied to an external resistor R connected in series with the output terminal of the sensor 120. The controller 200 may be configured to calculate the sensed current Is using the detected voltage and a resistance value of the external resistor R. The controller 200 may be configured to measure the load current using the external resistor R, and may be configured to turn on or off of the power switch 100 based on the measured load current to control the driving of the load A. When the sensor 120 of the power switch 100 detects an over-current, the controller 200 may be configured to turn off the power switch 100 to block the over-current from being transferred to the load A. The above-mentioned controller 200 may be implemented as a micro controller unit (MCU), a central processing unit (CPU), or the like.

Figure 3:
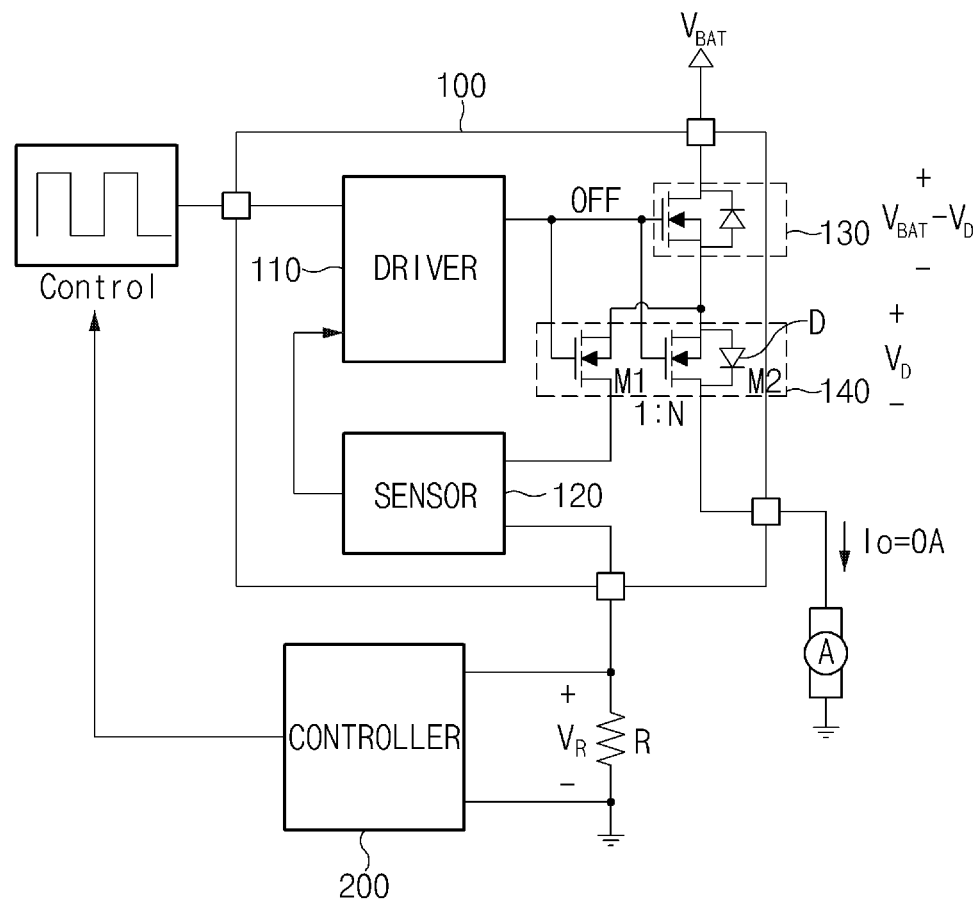
FIG. 3 is an exemplary diagram illustrating an off operation of the power switch according to an exemplary embodiment of the present disclosure.

FIG. 3 is an exemplary diagram illustrating an off operation of the power switch according to an exemplary embodiment of the present disclosure. The controller 200 may be configured to instruct the load A to terminate the driving thereof, the driver 110 may be configured to terminate the operation of the switch 130 and the protector 140 based on the controller 200. In other words, the driver 110 may be configured to input an off signal to the gate terminals of the high voltage FET 130, the first FET M1, and the second FET M2. Since the parasitic diode D of the second FET M2 may be formed forwardly with the voltage $V_{BAT}$ of the battery when the high voltage FET 130, the first FET M1, and the second FET M2 are in an off state, a forward voltage $V_D$ of the parasitic diode D may be applied to the second FET M2, and a substantial amount of the voltage $V_{BAT}$ of the battery may be applied to the high voltage FET 130.

The voltage $V_{BAT}$ of the battery of tens of voltages V or more may occur due to a spark voltage that may occur at the time of turn on or off, due to a load dump that may occur in the vehicle or characteristics of a coil in a motor, and a substantial portion of the voltage $V_{BAT}$ may be applied to the high voltage FET 130. A voltage $V_{GS}$ between the gate terminal and the source terminal of the high voltage FET 130, the first FET M1, and the second FET M2, a voltage $V_{DS.high\ voltage}$ between the drain terminal and the source terminal of the high voltage FET 130, and a voltage $V_{DS.low\ voltage}$ between the drain terminal and the source terminal of the first FET M1 and the second FET M2 are as follow.

$$V_{GS}=0V$$

$$V_{DS.high\ voltage}=V_{BAT}-V_D$$

$$V_{DS.low\ voltage}=V_D(0.7V)$$

Figure 4:
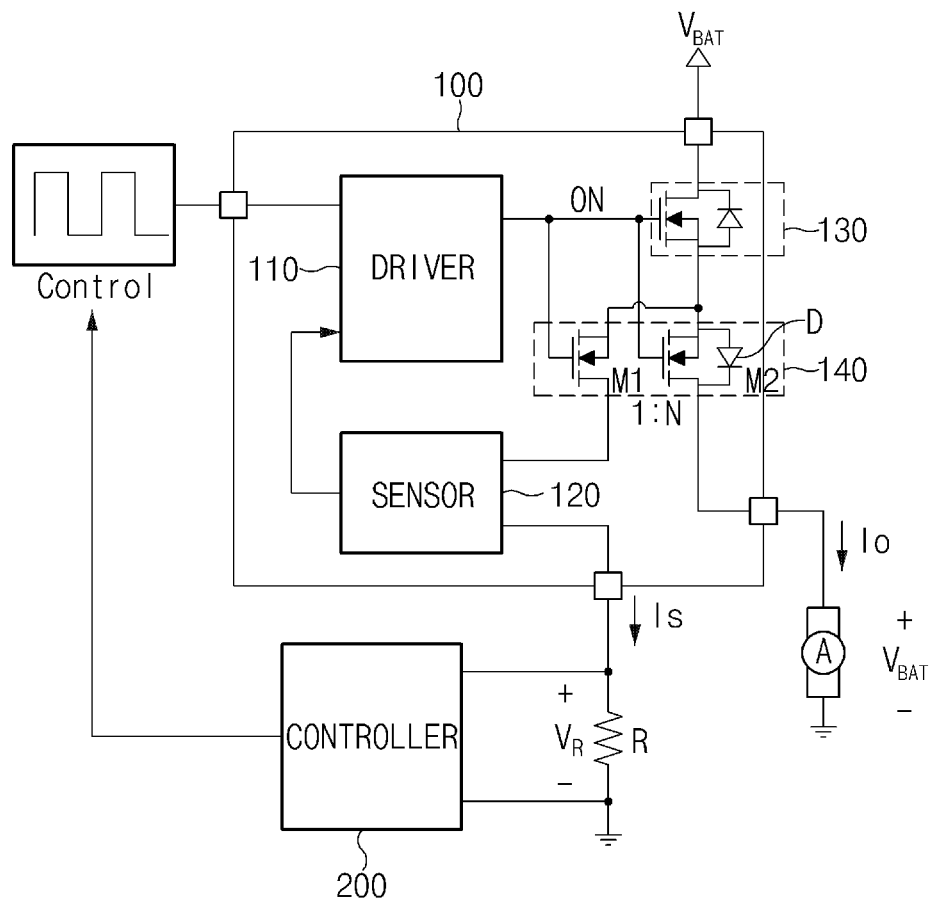
FIG. 4 is an exemplary diagram illustrating an on operation of the power switch according to an exemplary embodiment of the present disclosure.

FIG. 4 is an exemplary diagram illustrating an on operation of the power switch according to an exemplary embodiment of the present disclosure. When the controller 200 instructs the load A to be driven, the driver 110 may be configured to operate the switch 130 and the protector 140 based on operation of the controller 200. In other words, the driver 110 may be configured to input an on signal to the gate terminals of the high voltage FET 130, the first FET M1, and the second FET M2. Since the driver 110 and the sensor 120 maintain an on state thereof when the high voltage FET 130, the first FET M1, and the second FET M2 are in an on state, and substantial portion of the voltage $V_{BAT}$ of the battery may be applied across the load A when the high voltage FET 130, the first FET M1, and the second FET M2 are turned on, a problem does not occur in the first FET M1 and the second FET M2. In particular, the voltage $V_{GS}$ between the gate terminal and the source terminal of the high voltage FET 130, the first FET M1, and the second FET M2, the voltage $V_{DS.high\ voltage}$ between the drain terminal and the source terminal of the high voltage FET 130, and the voltage $V_{DS.low\ voltage}$ between the drain terminal and the source terminal of the first FET M1 and the second FET M2 are as follow.

$$V_{GS}=V_{BAT}+12V$$

$$V_{DS.high\ voltage}=I_O \times R_{DS.ON.high\ voltage}$$

$$V_{DS.low\ voltage}=I_O \times R_{DS.ON.low\ voltage}$$

For example, $R_{DS.ON.high\ voltage}$ may include a resistance value between the drain terminal and the source terminal of the high voltage FET 130 when the high voltage FET 130 is turned on, and $R_{DS.ON.low\ voltage}$ may include a resistance value between the drain terminal and the source terminal of the first FET M1 and the second FET M2 when the first FET M1 and the second FET M2 are turned on.

Figure 5:
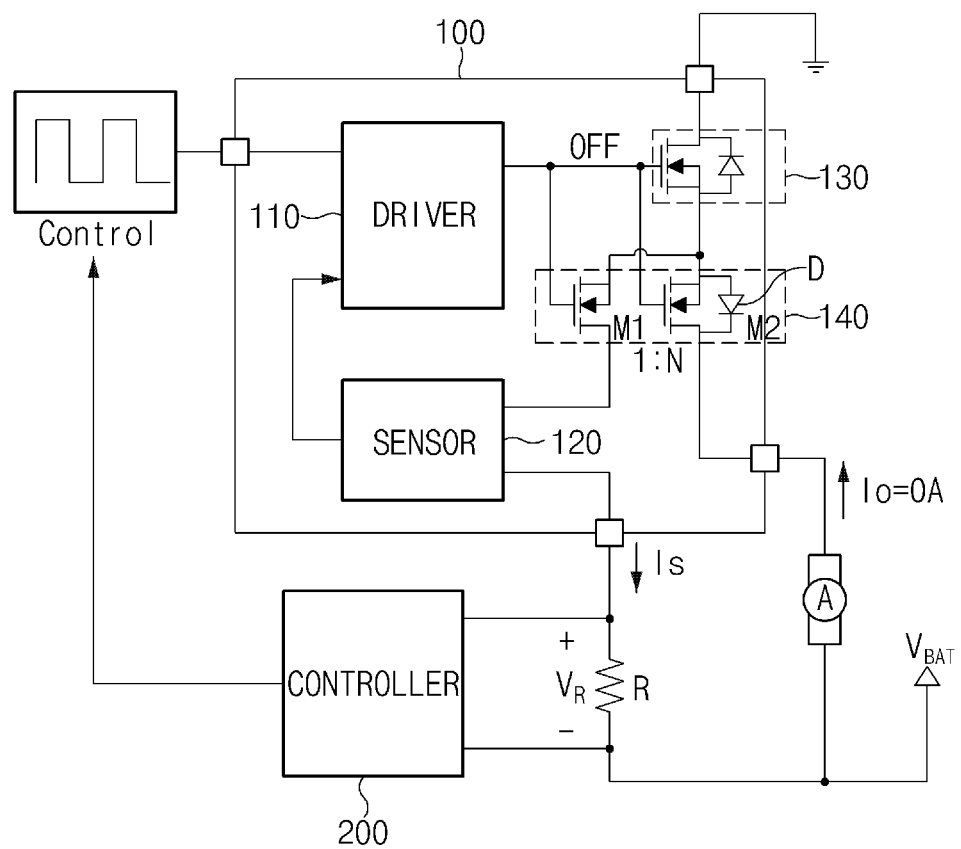
FIG. 5 is an exemplary diagram illustrating an operation of the power switch when a battery is reversely connected, according to an exemplary embodiment of the present disclosure.

FIG. 5 is an exemplary diagram illustrating an operation of the power switch when a battery is reversely connected, according to an exemplary embodiment of the present disclosure. As illustrated in FIG. 5, when a power source of the battery is reversely connected, the power is not applied to the driver 110, the output does not occur. Accordingly, the high voltage FET 130, the first FET M1, and the second FET M2 maintain the off state. In other words, since the parasitic diode of the second FET M2 may be backwardly connected to the voltage $V_{BAT}$ of the battery reversely connected, a reverse current may be blocked to prevent an occurrence of the reverse current.

As described above, according to the exemplary embodiments of the present disclosure, the current supplied from the battery when the battery is reversely connected may be blocked, to protect the power switch. According to the present disclosure, components configuring the power switch may be manufactured by the same process, the current may be configured to senses without the correction circuit that corrects process and temperature deviations, and the current sensing error may be improved. Further, according to the present disclosure, since a separation element such as the diode or the FET that prevents the reverse connection is not additionally required, a voltage drop and power loss due to an additional element connection may be reduced.

Hereinabove, although the present disclosure has been described with reference to exemplary embodiments and the accompanying drawings, the present disclosure is not limited thereto, but may be variously modified and altered by those skilled in the art to which the present disclosure pertains without departing from the spirit and scope of the present disclosure claimed in the following claims.

What is claimed is:

1. A power switch that prevents a reverse connection, the power switch comprising:
   a switch configured to supply power of a battery to a load or block the power of the battery;
   a protector coupled to an output terminal of the switch and configured to block the power applied from the battery when the battery is reversely connected; and
   a driver configured to adjust a driving of the switch and the protector, wherein the protector includes a first FET configured to measure a current and a second FET configured to block the current supplied from the battery by a parasitic diode when the battery is reversely connected, and the first FET and the second FET are internal low voltage FETs.

2. The power switch according to claim 1, wherein the switch is an internal high voltage field effect transistor (FET).

3. The power switch according to claim 2, wherein the high voltage FET has a n-type double-diffused metal oxide semiconductor (DMOS) structure.

4. The power switch according to claim 1, wherein gate terminals of the first FET and the second FET are coupled to an output terminal of the driver and source terminals of the first FET and the second FET are coupled to a source terminal of the high voltage FET.

5. The power switch according to claim 1, wherein the low voltage FET has an n-type complementary metal-oxide semiconductor (CMOS) structure.

6. The power switch according to claim 1, further comprising a sensor coupled to a drain terminal of the first FET and configured to sense a load current.

7. The power switch according to claim 6, wherein the first FET and the second FET are configured to transfer a current output from the switch at a ratio of 1:N.

8. The power switch according to claim 6, wherein the protector is disposed in the same integrated circuit as the sensor and the driver.

9. The power switch according to claim 6, wherein the driver is configured to operate a load driving based on a controller positioned on the exterior of the power switch.

10. The power switch according to claim 9, wherein the controller is configured to measure the load current using an external resistor connected in series with an output terminal of the sensor and configured to operate the driver based on the measured load current.

* * * * *